(12) United States Patent
Shin

(10) Patent No.: US 6,947,334 B2
(45) Date of Patent: Sep. 20, 2005

(54) SEMICONDUCTOR MEMORY DEVICE CAPABLE OF CALIBRATING DATA SETUP TIME AND METHOD FOR DRIVING THE SAME

(75) Inventor: Bo-Hyun Shin, Kyoungki-do (KR)

(73) Assignee: Hynix Semiconductor, INC, Kyoungki-Do (KR)

( * ) Notice: Subject to any disclaimer, the term of this patent is extended or adjusted under 35 U.S.C. 154(b) by 0 days.

(21) Appl. No.: 10/879,561

(22) Filed: Jun. 28, 2004

(65) Prior Publication Data

US 2005/0141330 A1 Jun. 30, 2005

(30) Foreign Application Priority Data

Dec. 29, 2003 (KR) .................. 10-2003-0098495

(51) Int. Cl.[7] .............................................. G11C 7/00
(52) U.S. Cl. .................. 365/189.01; 327/106; 326/87
(58) Field of Search .............. 365/189.01; 327/108; 326/87

(56) References Cited

U.S. PATENT DOCUMENTS

2004/0174193 A1 * 9/2004 Song .......................... 327/108
2005/0057281 A1 * 3/2005 Yoo ............................ 326/87

* cited by examiner

*Primary Examiner*—Anh Phung
*Assistant Examiner*—N Nguyen
(74) *Attorney, Agent, or Firm*—Blakely, Sokoloff, Taylor & Zafman

(57) ABSTRACT

There is provided a synchronous memory device, in which a data input setup timing is calibrated. The synchronous memory device includes: a data input unit for calibrating a timing of data inputted in synchronization with a data strobe signal; and a first setup time control unit for detecting an input timing of an OCD control code data inputted to the data input unit in an OCD calibration mode, and for controlling a data output timing of the data input unit.

25 Claims, 11 Drawing Sheets

US 6,947,334 B2

SEMICONDUCTOR MEMORY DEVICE CAPABLE OF CALIBRATING DATA SETUP TIME AND METHOD FOR DRIVING THE SAME

FIELD OF THE INVENTION

The present invention relates to a semiconductor memory device; and, more particularly, to a DDR memory device which is capable of efficiently calibrating data setup time.

DESCRIPTION OF RELATED ART

Developments on semiconductor memory devices have been kept on in order to obtain high integration and improved operating speed. Synchronous memory devices operating in synchronization with external clock have been introduced to improve the operating speed.

Among the synchronous memory devices, a single data rate (SDR) memory device inputs/outputs one data through one data pin for one clock cycle in synchronization with rising edges of an external clock.

However, such an SDR memory device is insufficient to satisfy a speed requirement in a high-speed system. Accordingly, a double data rate (DDR) memory device that processes two data for one clock cycle has been proposed.

The DDR memory device inputs/outputs two consecutive data through input/output pins in synchronization with rising and falling edges of the external clock. The DDR memory device can provide at least two times bandwidth as wide as the conventional SDR memory device without increasing the clock frequency, thereby obtaining a higher operation.

However, since the DDR memory device must input/output two data for one clock cycle, data access method employed in the conventional synchronous memory device cannot be used any more.

If the clock cycle is about 10 nsec, two consecutive data must be substantially processed within about 6 nsec or less, except for the rising and falling times (about 0.5×2=2) and time for meeting other specifications. However, it is difficult to perform the process within the memory device. Therefore, the memory device operates in the synchronization with the rising and falling edges of the clock only when inputting/outputting data from/to an external circuit. Substantially, the two data are processed in synchronization with one edge of the clock within the memory device.

Accordingly, a data input unit of DDR memory device prefetches and aligns external data inputted at rising and falling edges of a clock signal and then outputs the data to a core area one time at every period.

Meanwhile, several new conceptions are proposed for higher data transmission speed of the DDR memory device. In a specification of DDR2 synchronous memory device, which is proposed at Joint Electron Device Engineering Council (JEDEC), there is a conception of "Off Chip Driver (OCD)" calibration control, which can calibrate an impedance of an output unit of the DDR memory device.

The OCD calibration control includes additional circuits for calibrating the impedance of an output driver used to output data. The OCD calibration control is to find an optimum impedance of the output driver in a current system and calibrate by measuring voltage or current flowing through the output driver of the memory device from external devices such as chipset and to calibrate the impedance of the output driver.

For this purpose, the DDR2 synchronous memory device further includes an OCD controller which is capable of calibrating an impedance of a data output driver.

FIG. 1 is a block diagram illustrating data input/output between a DDR synchronous memory device and a chipset.

Referring to FIG. 1, the DDR synchronous memory device performs a data interfacing with the chipset. The memory device receives command signals from the chipset through a plurality of command input pins /CS, /WE, CK, /CK, etc., and receives addresses through a plurality of addresses signal input pins A0 to A15.

Also, data transmission and reception are performed between the memory device and the chipset through a plurality of data pins DQ0 to DQ15. A data input buffer 20 and a data output buffer 30 are connected to one data pin (fore example, DQ0). The data input buffer 20 buffers data and transmits the buffered data to the memory core and the data receives the data from the memory core and outputs the data to an external circuit (Refer to an area A).

Meanwhile, the DDR synchronous memory device receives data from the chipset in synchronization with data strobe signal DQS and inverted data strobe signal, which are inputted through data strobe signal input/output pins DQS and /DQS. Also, the DDR synchronous memory device outputs data in synchronization with data strobe signal and inverted data strobe signal, which are outputted through data strobe signal input/output pins DQS and /DQS.

FIG. 2 is a block diagram of a conventional DDR synchronous memory device.

Referring to FIG. 2, the conventional DDR synchronous memory device includes a data input buffer 10, a data strobe signal input buffer 60, a data align unit 20, a memory core area 30, a data output driver 40, and an OCD controller 50.

The data input buffer 10 buffers data inputted through data input/output pad (DQ pad). The data strobe signal input buffer 60 generates an align signal DQS_align using data strobe signal DQS, which is inputted through the data strobe signal input pin. The data align unit 20 aligns the buffered data in response to the align signal DQS_align. The memory core area 30 includes a plurality of unit cells and stores the aligned data into a selected unit cell. The data output driver 40 receives an output data D_out, which is outputted to the memory core area 30, and outputs the output data D_out through data input/output pad DQ_pad. The OCD controller 50 calibrates an output impedance of the data output driver 40 according to an OCD control code, which is outputted from the chipset.

FIG. 3A is a waveform illustrating an operation of measuring a data output impedance during an OCD operation mode in the memory device of FIG. 2, and FIG. 3B is a waveform illustrating an operation of calibrating a data output impedance during an OCD operation mode in the memory device of FIG. 2.

Hereinafter, an OCD operation of the conventional DDR synchronous memory device will be described with reference to FIGS. 1, 2, 3A and 3B. The OCD calibration control is to optimally calibrate the output impedance of the data output buffer in the memory device.

The OCD calibration control includes a measurement mode for measuring the output impedance of the data output buffer and a calibration mode for calibrating the output impedance of the data output buffer.

In the measurement mode, the data output driver 40 outputs a logic high level signal or a logic low level signal, and the chipset measures the output impedance of the data output driver. A mode of outputting a logic high level from the data output driver 40 is referred to as a Drivel mode, and a mode of outputting a logic low level from the data output driver 40 is referred to as a Drive0 mode. An operation of the measurement mode is shown in FIG. 3A.

In the calibration mode, based on the measured impedance, the chipset inputs 4-bit code signal to the data input buffer 10 in order to calibrate the impedance of the output driver.

Then, the data align unit 20 aligns the code signal into an OCD control code and outputs the OCD control code to the controller 50.

The OCD controller 50 decodes the OCD control code to calibrate the output impedance of the data output driver 40. The impedance calibration of the data output driver 40 is achieved by connecting a plurality of MOS transistors to pull-up driver and pull-down driver in parallel, turning on the predetermined number of the MOS transistors, and adjusting the number of the MOS transistors that are turned on in response to the decoded OCD control signal. After the number of the turned-on MOS transistors in the pull-down driver and the pull-up driver of the data output driver is adjusted, the OCD calibration mode is exited.

Meanwhile, the DDR synchronous memory device receives data in synchronization with the data strobe signal. A timing margin is insufficient when data are received in synchronization with both rising edges and falling edges of the operation clock. Therefore, after the DDR synchronous memory device receives data in synchronization with the DQS signal, it is internally synchronized with the operation clock again.

Also, the DDR synchronous memory device processes 2-bit data signals or 4-bit data signals at the same time. The data align unit aligns the consecutive data in response to the align signal DQS_align and outputs them to the memory core area 30.

With the advance of technologies, the memory device operates at a higher speed. A frequency of the operation clock also becomes higher and thus one period of the DQS signal becomes shorter.

Also, a setup timing when the memory device receives data from an external circuit is gradually reduced. The setup timing is a timing margin that stably inputs data with respect to the DQS signal. In other words, the memory device can stably receive data when the data are inputted to the data input buffer 10 within the setup timing.

Even if the memory device operates with the predefined setup timing, an input timing of data inputted from an external circuit may be different depending on the systems to which the memory device is applied. In such a case, data cannot be stably inputted within the setup timing of the memory device. Also, the setup timing of the input buffer may be internally changed depending on the manufacture and design conditions of the data input buffer.

SUMMARY OF THE INVENTION

It is, therefore, an object of the present invention to provide a memory device and a method for driving the same, in which data input setup timing can be calibrated using an input timing of data that are inputted in an OCD calibration mode.

In an aspect of the present invention, there is provided a synchronous memory device configured to receive data in synchronization with data strobe signal. The synchronous memory device includes: a data input unit for calibrating a timing of data inputted in synchronization with the data strobe signal; and a first setup time control unit for detecting an input timing of an OCD control code data inputted to the data input unit in an OCD calibration mode, and for controlling a data output timing of the data input unit.

In another aspect of the present invention, there is provided a method for driving a synchronous memory device, which is configured to receive data in synchronization with data strobe signal and has an OCD calibration mode. The method includes the steps of: detecting an input timing of an OCD control code data, the OCD control code being synchronized with the data strobe signal and inputted to a data input unit for an OCD calibration mode; and calibrating a data setup timing of the data input unit using the input timing of the detected OCD control code.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, the present invention will be described in detail with reference to the accompanying drawings.

Figure 1:
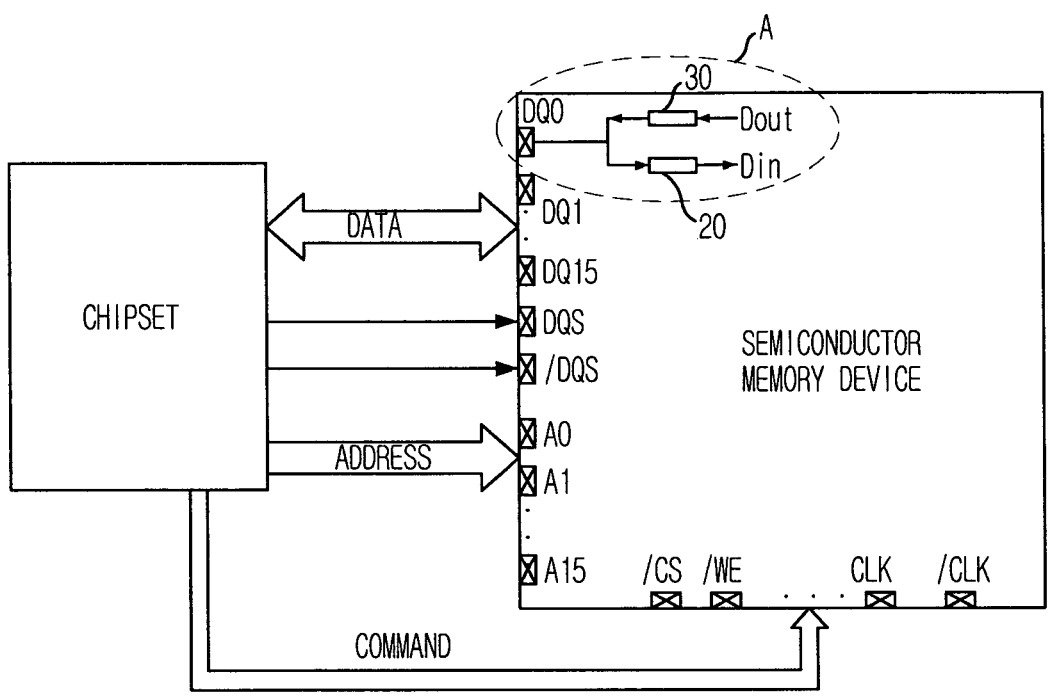
FIG. 1 is a block diagram illustrating data input/output between a DDR synchronous memory device and a chipset.
Figure 2:
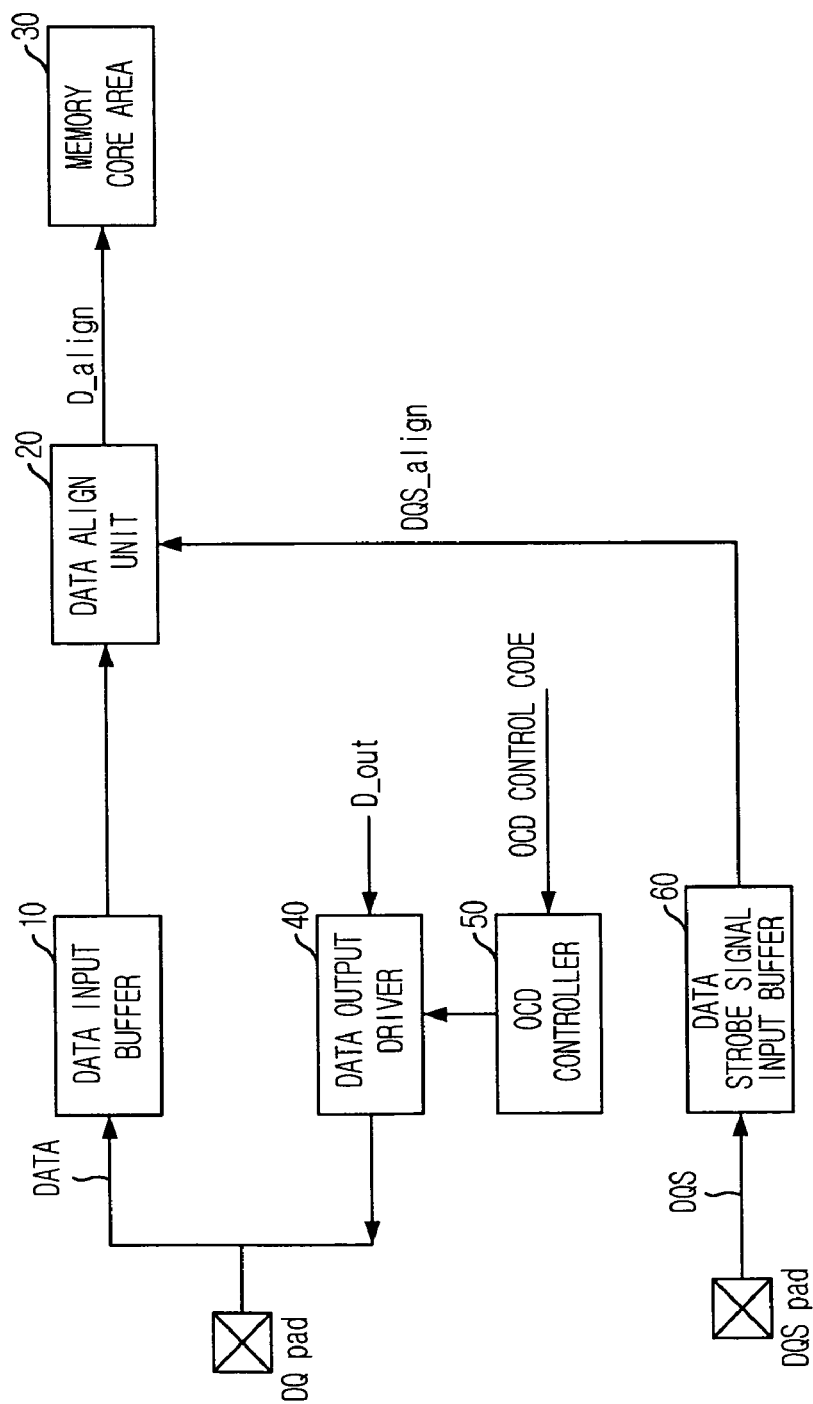
FIG. 2 is a block diagram of a conventional DDR synchronous memory device.
Figure 3A:
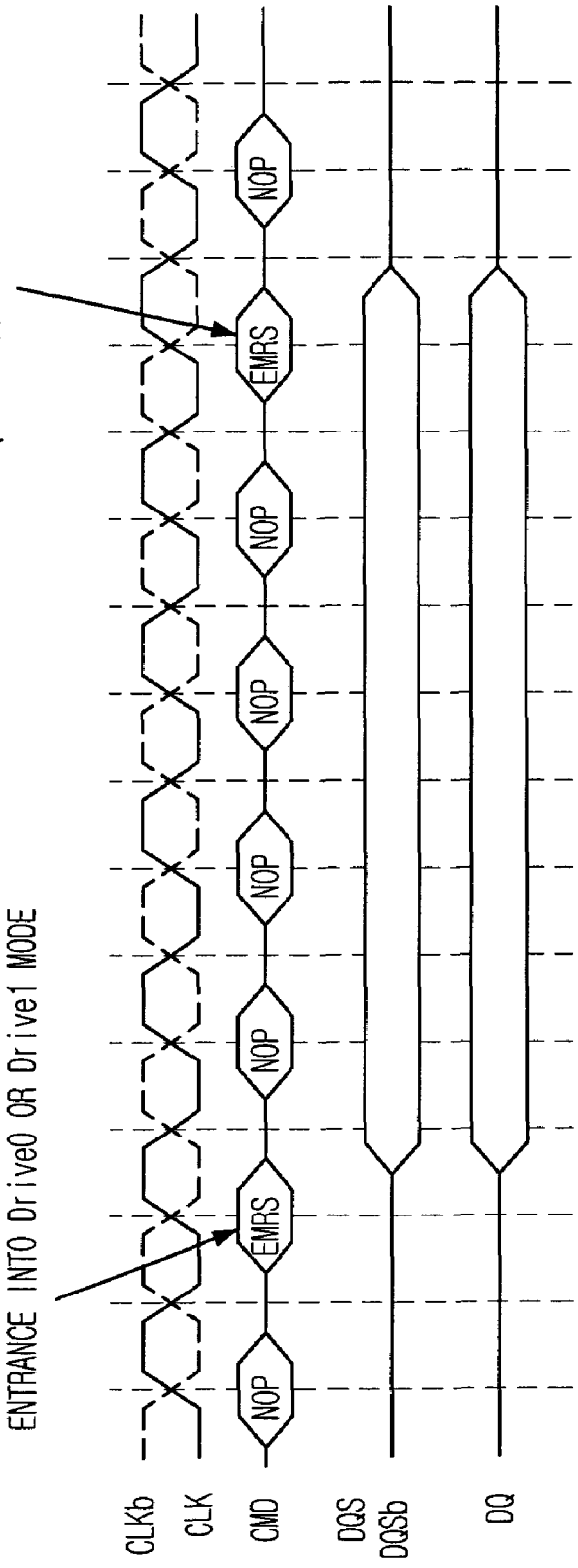
FIG. 3A is a waveform illustrating an operation of measuring a data output impedance during an OCD operation mode in the memory device of FIG. 2.
Figure 3B:
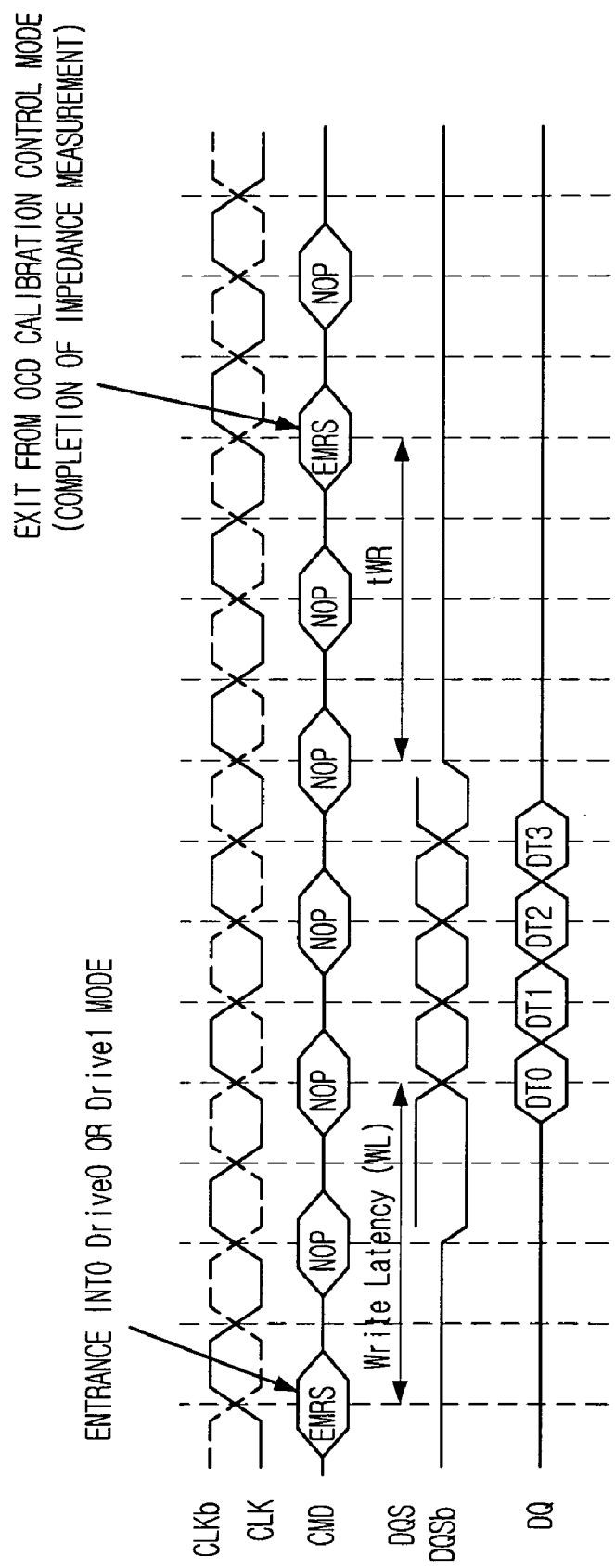
FIG. 3B is a waveform illustrating an operation of calibrating a data output impedance during an OCD operation mode in the memory device of FIG. 2.
Figure 4:
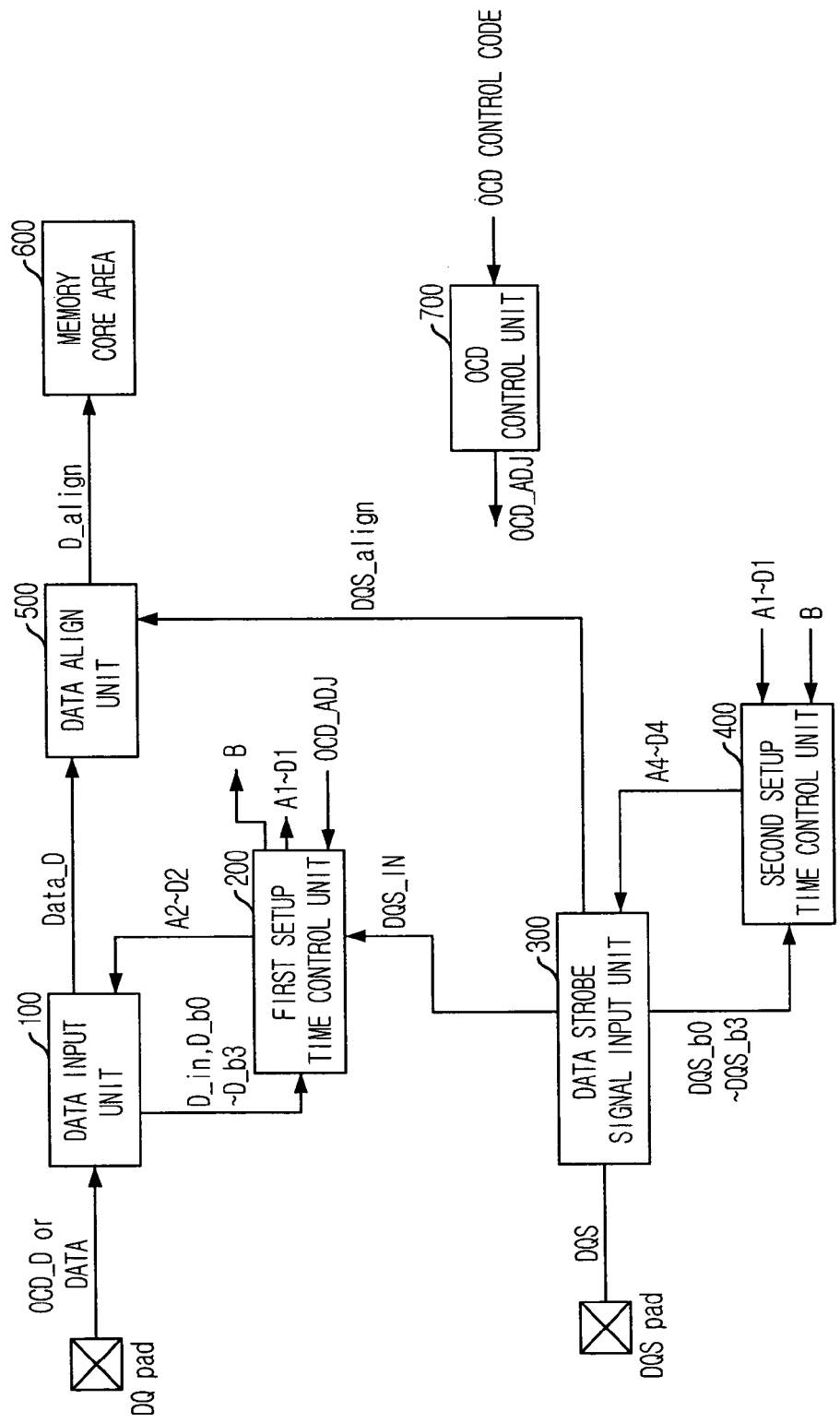
FIG. 4 is a block diagram of a synchronous memory device in accordance with a preferred embodiment of the present invention.

FIG. 4 is a block diagram of a synchronous memory device in accordance with a preferred embodiment of the present invention.

Referring to FIG. 4, the synchronous memory device includes a data input unit 100 and a first setup time control unit 200. The data input unit 100 calibrates a timing of data that are inputted through data pad DQ pad in synchronization with a data strobe signal DQS. The first setup time control unit 200 detects an input timing of an OCD control code data OCD_D that are inputted to the data input unit 100 in an OCD calibration mode, and controls an output timing of data that are outputted from the data input unit 100.

The first setup time control unit 200 detects an input timing of the data strobe signal DQS, which corresponds to a timing when the OCD control code data OCD_D is inputted to the data input unit 100, and outputs a plurality of first timing detection signals A2 to D2 that are selectively activated. The data output timing of the data input unit 100 is controlled in response to the plurality of first timing detection signals A2 to D2.

The first setup time control unit 200 is enabled by an OCD control signal OCD_ADJ. The OCD control signal OCD_ADJ is outputted from an OCD control unit 700, which controls an OCD calibration operation, and is activated during the OCD calibration operation.

Also, the synchronous memory device in accordance with the present invention further includes a data strobe signal input unit 300 and a second setup time control unit 400. The data strobe signal input unit 300 generates the data align signal using the data strobe signal DQS inputted through the DQS pad. The second setup time control unit 400 controls the output timing of the data align signal DQS_align in response to the first timing detection signal A2 to D2.

Further, the synchronous memory device in accordance with the present invention further includes a data align unit 500. The data align unit 500 aligns data Data_D, which are consecutively outputted from the data input unit 100, in synchronization with the data align signal DQS_align and outputs the aligned data D_align to the memory core area 600.

Figure 5:
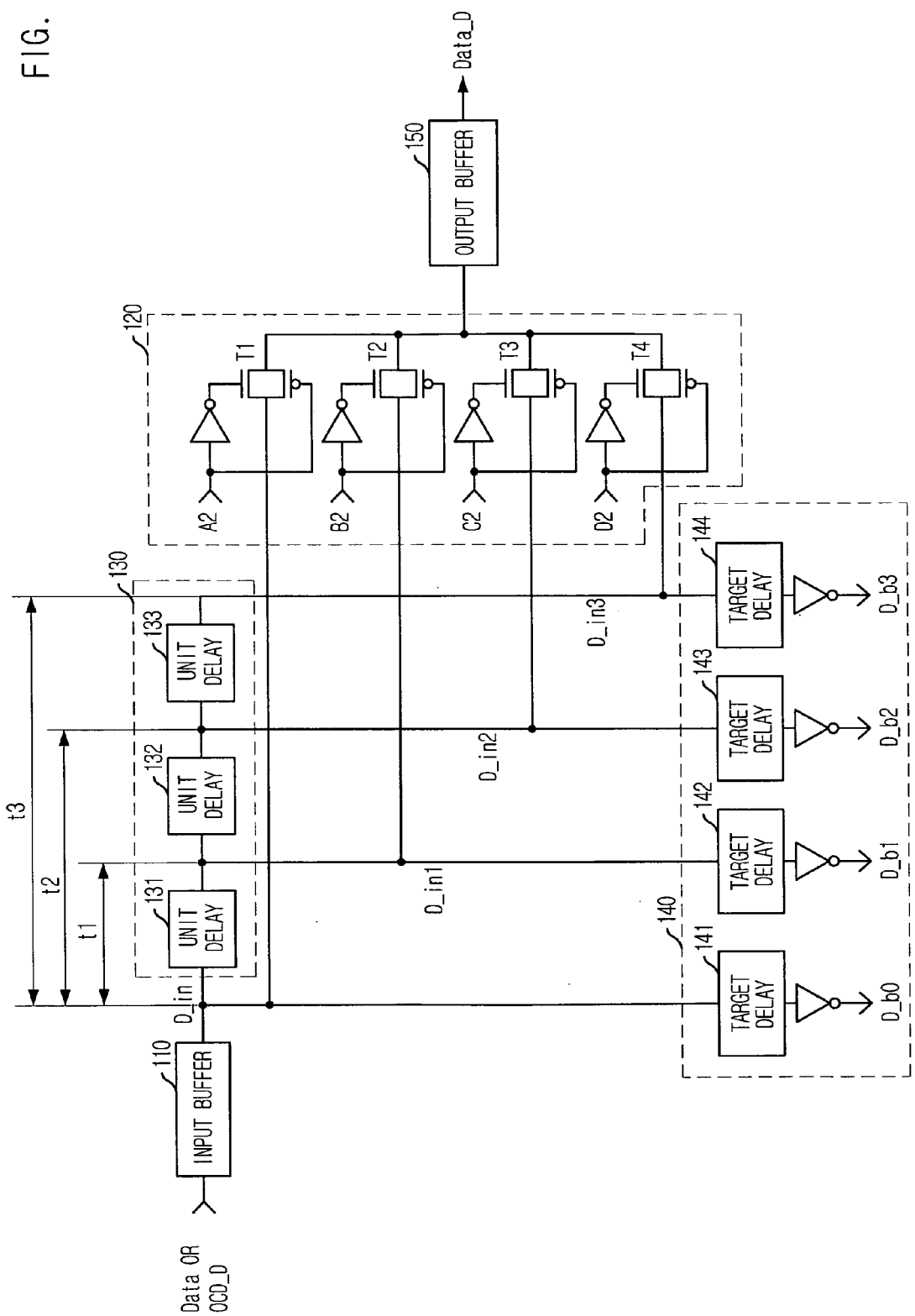
FIG. 5 is a circuit diagram of the data input unit shown in FIG. 4.

FIG. 5 is a circuit diagram of the data input unit 100 shown in FIG. 4.

Referring to FIG. 5, the data input unit 100 includes an input buffer 110, a delay unit 130, a second delay unit 140, a data transfer unit 120, an output buffer 150.

The input buffer 110 buffers input data. The first delay unit 130 delays an output data signal of the input buffer 110 by first to third delay times. The second delay unit 140 delays an output signal D_in of the input buffer 110 and the delayed data signals D_in1 to D_in3 by a timing corresponding to the setup time of the data signal Data with respect to the data strobe signal DQS and outputs first to fourth delayed data signals D_b0 to D_b3. The data transfer unit 120 selectively outputs the data signals D_b0 to D_b3 in response to a plurality of timing control signals A2 to D2. The output buffer 150 buffers an output data signal of the data transfer unit 120.

The first delay unit 130 includes serially-connected unit delay elements 131 to 133 and delays the data signal D_in by a predetermined unit time to output the data signal D_in1 to D_in3.

The second delay unit 140 includes a plurality of target delay elements 141 to 144.

The data transfer unit 120 includes transmission gates T1 to T4. The transmission gates T1 to T4 are turned on in response to a plurality of timing control signals A2 to D2, which are selectively activated, and transmits one signal among the data signal D_in and the data signals D_b0 to D_b3 that are delayed by the first to third delay time t1, t2 and t3.

Figure 6:
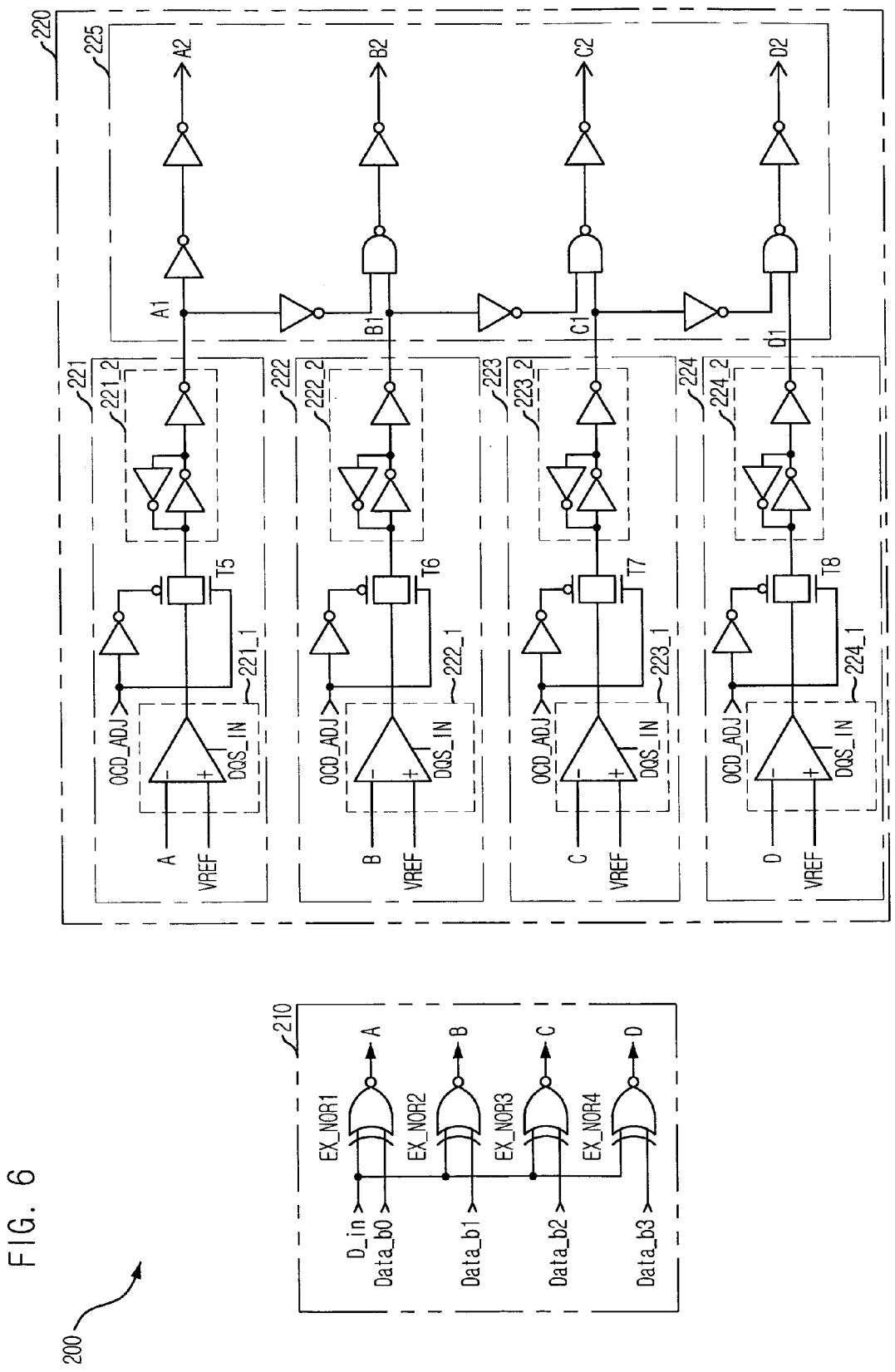
FIG. 6 is a circuit diagram of the first setup time control unit shown in FIG. 4.

FIG. 6 is a circuit diagram of the first setup time control unit 200 shown in FIG. 4.

Referring to FIG. 6, the first setup time control unit 200 includes a setup time detecting pulse generating unit 210 and a timing detecting unit 220. The setup time detecting pulse generating unit 210 generates first to fourth pulse signals A to D having pulse periods corresponding to the intervals between the data signal D_in of the input buffer 110 and the first to fourth delayed data signals D_b0 to D_b3. The timing detecting unit 220 is enabled in response to the OCD control signal OCD_ADJ, which is activated in the OCD calibration mode, and compares the input timing of the data strobe signal DQS with the pulse periods of the first to fourth pulse signals A to D to output the first timing detection signals A2 to D2, which are selectively activated.

The pulse generating unit 210 includes first to fourth exclusive NOR gates EX_NOR1 to EX_NOR4 which respectively receive the data signal D_in and the delayed data signals D_b0 to D_b3 and output the first to fourth pulse signals A to D.

The timing detecting unit 220 includes first to fourth unit timing detection units 221 to 224 and a timing detection signal output unit 225.

The first to fourth unit timing detection units 221 to 224 receives one of the first to fourth pulse signals A to D and activate the output signals A1 to D1 if the input timing of the data strobe signal DQS is contained during the activation period of the inputted pulse signal. The timing detection signal output unit 225 receives the output signals of the unit timing detection units 221 to 224 and outputs the first timing control signals A2 to D2 that are selectively activated.

The first unit timing detection unit 221 includes a timing detection signal input unit 221_1, a transmission gate T5, and a latch 221_2.

The timing detection signal input unit 221_1 receives one of the first to fourth pulse signals A to D at the input timing of the data strobe signal DQS_IN. The transmission gate T5 is turned on in response to the OCD control signal OCD_ADJ and transfers an output signal of the timing detection signal input unit 221_1. The latch 221_2 latches the output signal of the transmission gate T5.

The first timing detection signal input unit 221_1 includes an operational amplifier. The operational amplifier is enabled in response to the data strobe signal DQS_IN and has a positive (+) terminal receiving the inputted pulse signal A and a negative (−) terminal receiving a reference signal VREF.

The timing detection signal output unit 221_2 is configured to activate only the first timing detection signal corresponding to the output signal that is activated for the first time among the signals outputted in the timing detection. For example, if the output signals B2, C2 and D2 are activated to logic high level, only the first timing detection signal B2 is activated to a logic high level.

Figure 7:
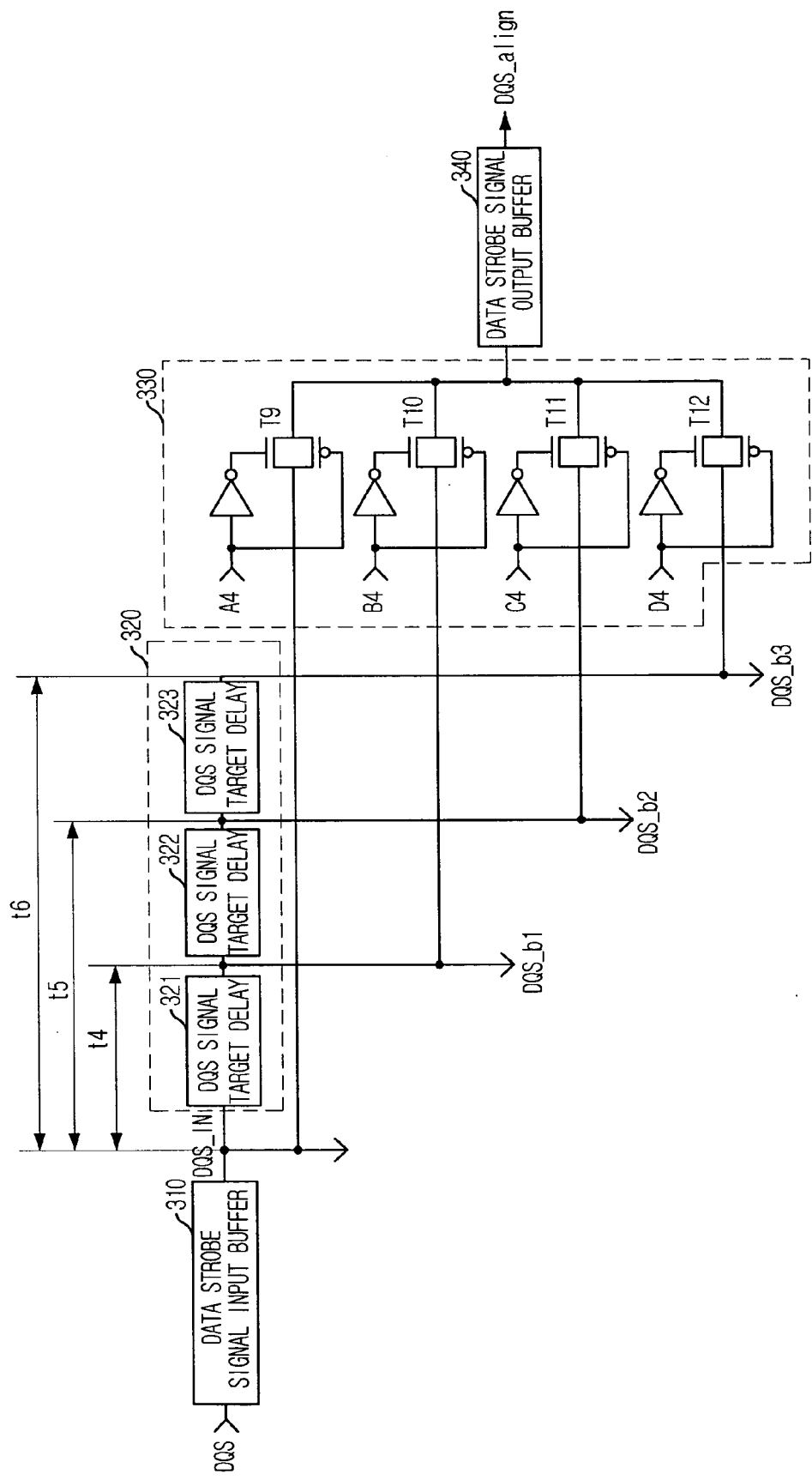
FIG. 7 is a circuit diagram of the data strobe signal input unit shown in FIG. 4.

FIG. 7 is a circuit diagram of the data strobe signal input unit 400 shown in FIG. 4.

Referring to FIG. 7, the data strobe signal input unit 300 includes a data strobe signal input buffer 310, a third delay unit 320, a data strobe signal transfer unit 330, and a data strobe signal output buffer 340.

The data strobe signal input buffer 310 buffers the data strobe signal DQS and outputs the first data strobe signal DQS_IN. The third delay unit 320 delays the first data strobe signal DQS_IN by fourth to sixth delay time t4, t5 and t6 and outputs second to fourth data strobe signals DQS_b1, DQS_b2 and DQS_b3. The data strobe signal transfer unit 330 transfers one of the first to fourth data strobe signals DQS_IN, DQS_b1, DQS_b2 and DQS_b3 in response to a plurality of second timing control signals A4 to D4, which are outputted from the second setup time control unit 400 and are selectively activated. The data strobe signal output buffer 340 buffers the data strobe signal transferred from the data strobe signal transfer unit 330 and outputs the data align signal DQS_align.

The data strobe signal transfer unit 330 includes transmission gates T9 to T12 which are respectively turned on in response to the second timing control signals A4 to D4 to transfer the first to fourth data strobe signals DQS_IN, DQS_b1, DQS_b2 and DQS_b3.

The third delay unit 320 includes serial-connected DQS signal target delay elements 131 to 133 and delays the first data strobe signal DQS_IN by the fourth to sixth delay time t4, t5 and t6 and outputs the second to fourth data strobe signals DQS_b1, DQS_b2 and DQS_b3.

Figure 8:
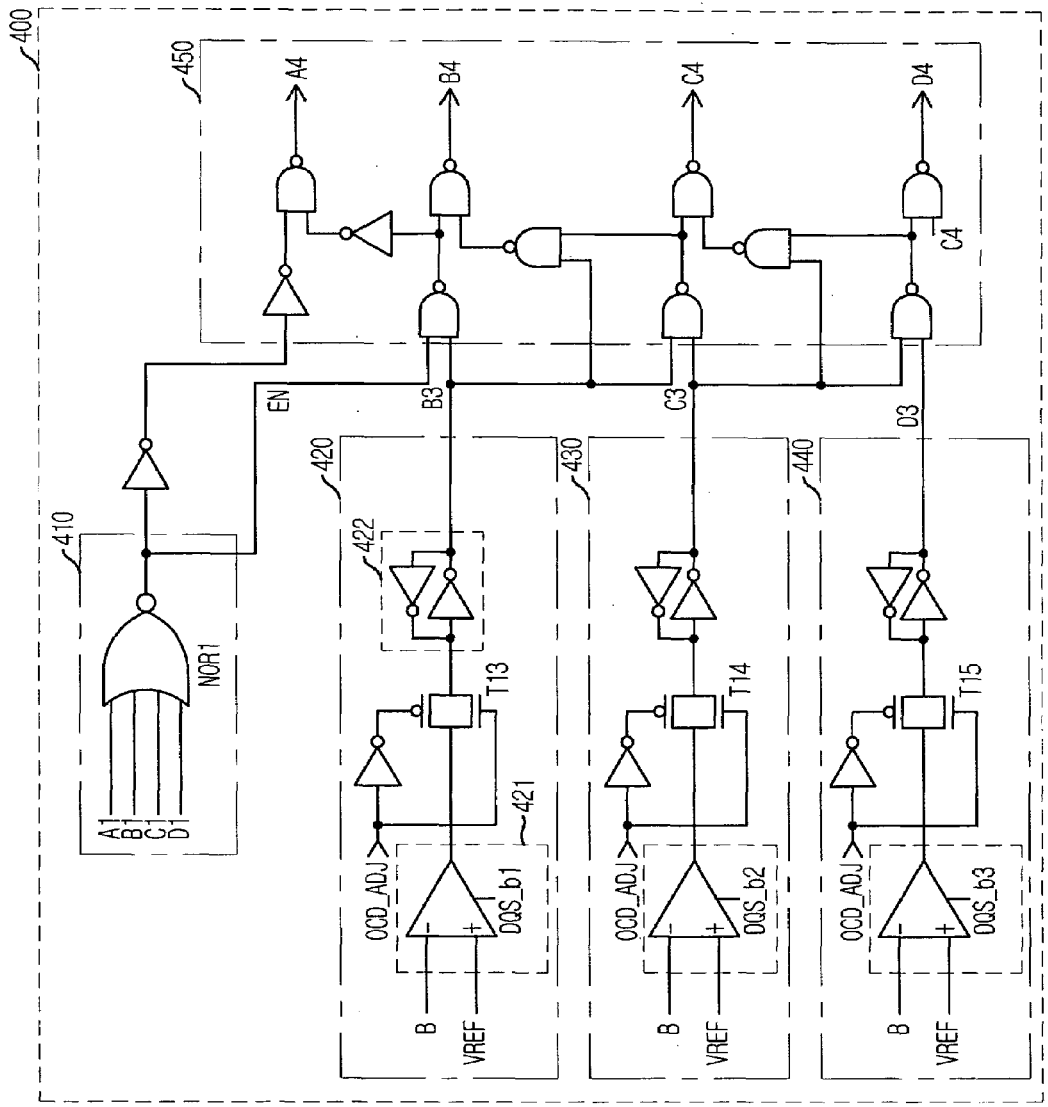
FIG. 8 is a circuit diagram of the second setup time control unit shown in FIG. 4.

FIG. 8 is a circuit diagram of the second setup time control unit 400 shown in FIG. 4.

Referring to FIG. 8, the second setup time control unit 300 includes a data strobe adjustment enable unit 410, unit timing detection units 420 to 440, and a timing detection signal output unit 450.

The data strobe adjustment enable unit 410 detects a state in which all of the first timing detection signals A2 to D2 are inactivated, and outputs an enable signal EN. The unit timing detection units 420 to 440 are enabled in response to the OCD control signal OCD_ADJ and compares a timing of the pulse signal (for example, the second pulse signal B) selected among the first to fourth pulse signals A to D with a timing of one signal selected among the second to fourth data strobe signals DQS_b1 to DQS_b3. The timing detection signal output unit 450 is enabled in response to the enable signal EN and combines the output signals B3, C3 and D3 of the unit timing detection unit 420 to 440 to output the second timing detection signals A4 to D4, which are selectively activated.

The unit timing detection unit 420 includes a timing detection signal input unit 421, a transmission gate T13, and a latch 422.

The timing detection signal input unit 421 receives one pulse signal at an input timing of one delayed data strobe signal DQS_B1. The transmission gate T13 is turned on in response to the OCD control signal and transfers an output signal of the timing detection signal input unit 421. The latch 422 latches the output signal of the transmission gate T5.

The timing detection signal input unit 421 includes an operational amplifier. The operational amplifier is enabled in response to the second data strobe signal DQS_b1 and has a positive (+) terminal receiving the selected pulse signal B and a negative (−) terminal receiving a reference signal VREF.

The data strobe adjustment enable unit 410 includes a NOR gate which receives the first timing detection signals A1 to D1 and outputs the enable signal EN.

As described above, the synchronous memory device in accordance with the present invention calibrates the data setup timing by detecting the timing when the OCD control code OCD_D is inputted to the data input unit 100 in the OCD calibration mode.

The OCD calibration mode is an initial setting mode to calibrate the impedance of the data output buffer in the DDR synchronous memory device. As described above, the impedance of the data output unit of the memory device is measured in the OCD measurement mode and the optimum impedance suitable for the current system is found. In the OCD calibration mode, the impedance of the data output unit is calibrated using the found impedance.

In the OCD calibration mode, 4-bit OCD control code OCD_D is inputted to the data input unit. At this time, the inputted OCD control code OCD_D is also inputted in synchronization with the data strobe signal DQS, just like the general data input. The OCD control unit 700 of the synchronous memory device decodes the OCD control code OCD_D and calibrates the impedance of the data output unit.

In accordance with the present invention, the synchronous memory device finds the optimum setup time by comparing the input timing of the data strobe signal DQS in the OCD calibration mode with the input timing of the OCD control code OCD_D, and calibrates the setup time of the data input unit 100 according to the found setup time.

Here, the setup time means a time until the data strobe signal DQS is changed from the input of the data to the data input unit 100.

The DDR synchronous memory device that receives data in synchronization with the data strobe signal DQS transfers data from the data input unit to the data align unit 500 at the timing when the data strobe signal DQS is changed.

Therefore, the setup time is a minimum time in which data must be inputted to the data input unit 100 during a predetermined time period in order to stably transfer the data to the inside of the memory device before the data strobe signal is changed.

The data output unit of the memory device is designed to have the suitable setup time according to the specification. However, the setup time of the data input unit may be changed when the memory device is actually applied according to the states of the external semiconductor memory device, the driving voltage state during an operation, manufacturing conditions, etc.

In accordance with the present invention, the synchronous memory device compares the input timing of the data strobe signal DQS with the input timing of the OCD control code, which is inputted in the OCD calibration mode in order to calibrate the output impedance of the data output unit before the data access operation, and then calibrates the data setup time of the data input unit.

Since the DDR synchronous memory device can calibrate the setup time of the data input unit through the OCD calibration mode before the data access operation, an additional operation of calibrating the setup time of the data input unit is not required, thereby storing the setup time of the data input unit efficiently. In other words, the semiconductor memory device in accordance with the present invention is not required to additionally receive an external test data in order to calibrate the setup time of the data input unit. Thus, an additional setup time calibration mode is unnecessary.

Hereinafter, an operation of efficiently calibrating the data setup time will be described in detail.

The calibration of the data setup time is divided into two operations. A first setup time calibration operation is to calibrate the setup time by delaying the output timing of the data transferred from the data input unit 100 by a predetermined time, in case the input timing of the OCD control code OCD_D leads the input timing of the data strobe signal DQS.

A second setup time calibration operation is to calibrate the setup time by delaying the output timing of the data align signal DQS_align outputted from the data strobe signal input unit 300 by a predetermined time, in case the input timing of the OCD control code OCD_D lags behind the input timing of the data strobe signal DQS. The first setup time control unit 200 is provided for the calibration of the first setup time, and the second setup time control unit 400 is provided for the second setup time calibration.

Figure 9:
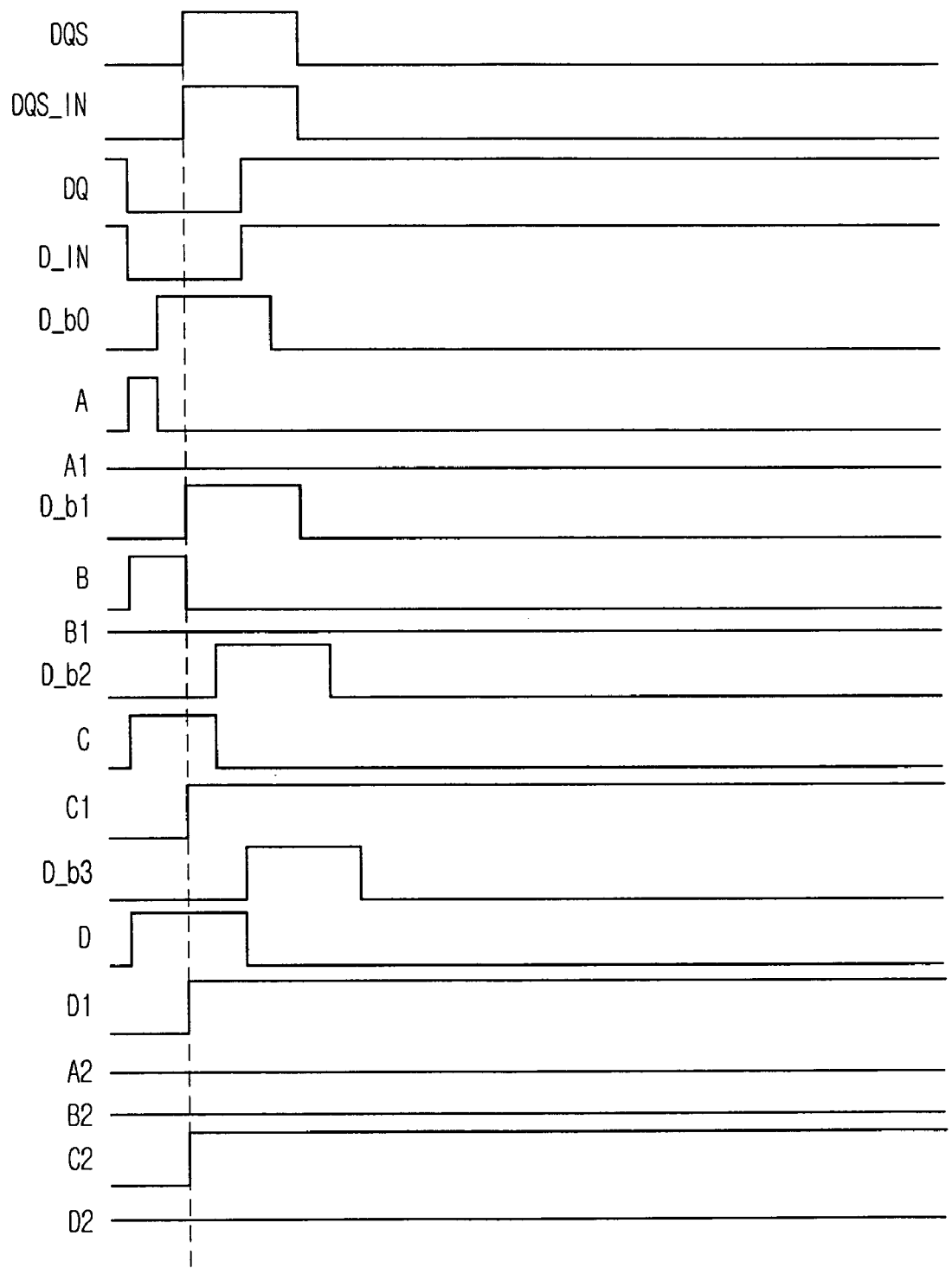
FIG. 9 is a waveform illustrating an operation of calibrating the data setup time when the data signal is inputted earlier than the data strobe signal.

FIG. 9 is a waveform illustrating an operation of calibrating the data setup time when the data signal is inputted earlier than the data strobe signal.

The first setup time calibration operation will be described with reference to FIGS. 4 to 9.

First, an input timing of the OCD control code OCD_D inputted to the data input buffer for the OCD calibration mode is detected.

In the operation of detecting the input timing of the OCD control code OCD_D, the data input buffer 110 of the data input unit buffers the inputted OCD control code OCD_D.

Then, the first delay unit 130 delays the output signal D_in of the input buffer 110 by the first to third delay time t1, t2 and t3 through the unit delay elements 131, 132 and 133.

The second delay unit 140 delays the output signal D_in of the input buffer 110 and the delayed signals D_in1 to D_in3 by a set target delay time through the target delay elements 141 to 144 to thereby output the first to fourth delayed signals D_b0 to D_b3.

The setup time detecting pulse generating unit 210 of the first setup time control unit 200 generates the first to fourth pulse signals A to D having pulse periods corresponding to the intervals between the data signal D_in of the input buffer 110 and the first to fourth delayed data signals D_b0 to D_b3.

The first timing detecting unit 220 of the first setup time control unit 200 compares the input timing of the data strobe signal DQS with the pulse periods of the first to fourth pulse signals A to D and outputs the first timing detection signals A2 to D2, which are selectively activated.

The respective timing detection units 221 to 224 receives one of the first to fourth pulse signals A to D and activate the output signals if the buffered data strobe signal DQS_IN is inputted during the pulse period of the inputted pulse signal.

The operational amplifiers of the timing detection units 221 to 224 operates in response to the buffered data strobe signal DQS_IN, and the transmission gates T5 to T8 are turned on in response to the OCD control signal OCD_ADJ outputted from the OCD control unit 700.

The timing detection signal output unit 225 combines the output signals of the timing detection units 221 to 224 and outputs the first timing control signals A2 to D2, which are selectively activated.

In FIG. 9, there is shown an operation of detecting a transition timing of the data strobe signal DQS_IN buffered corresponding to the pulse periods of the first to fourth pulse signals A to D. Here, after the data strobe signal DQS_IN buffered during the pulse periods of the third and fourth pulse signals C and D is inputted, the signals C2 and D2 outputted from the timing detection units 223 and 224 are activated to logic high level.

The timing detection signal output unit 225 combines the output signals C2 and D2 of the timing detection units 223 and 224 and outputs only the first timing detection signals C2 of logic high level.

If the first timing detection signal B2 is activated, the transmission gate T3 of the data input unit 100 is turned on.

The turn-on of the transmission gate T3 means that the output signals of the data input buffer 110 are transferred to the data output buffer 150 through the unit delay elements 131 and 132 of the first delay unit 130. In other words, even in the data access after the OCD calibration mode is finished, the data signals inputted to the data input unit 100 are delayed by a delay time corresponding to the unit delay elements 131 and 132 and then outputted to the data align unit 500.

This means that the data signals must be outputted to the data align unit 500 after they are delayed by a delay time corresponding to the unit delay elements 131 and 132 in order to optimally maintain the setup time with the data align signal DQS_align inputted to the data align unit 500.

As described above, the present invention detects the input timing of the OCD control code inputted for the OCD calibration mode, so that the setup time for the data input is efficiently calibrated without receiving an additional test data for data setup time.

After the OCD calibration mode is finished, a normal data access operation is performed. In detail, the data inputted to the data input unit 100 are outputted to the data align unit 500 through the unit delay elements 131 and 132.

The data strobe signal input unit 300 outputs the data align signal DQS_align to the data align unit 500 using the data strobe signal DQS.

The data align unit 500 aligns the output data signal Data_D of the data input unit 100 to thereby be synchronized with the data align signal DQS_align, and then outputs it to the memory core area 600.

At this time, the setup timing between the data signal inputted to the data align unit 500 and the data align signal has been already optimally calibrated in the OCD calibration mode. Thus, the data align unit 500 can perform the stable data align operation.

Although three unit delay elements are provided in the data input unit 100, the number of the unit delay elements can be adjusted depending on the applied conditions. If the number of the unit delay elements is changed, the number of the transmission gates of the data input unit 100 is changed and the number of the first timing detection signals from the first setup time control unit 200 is also changed properly.

Figure 10:
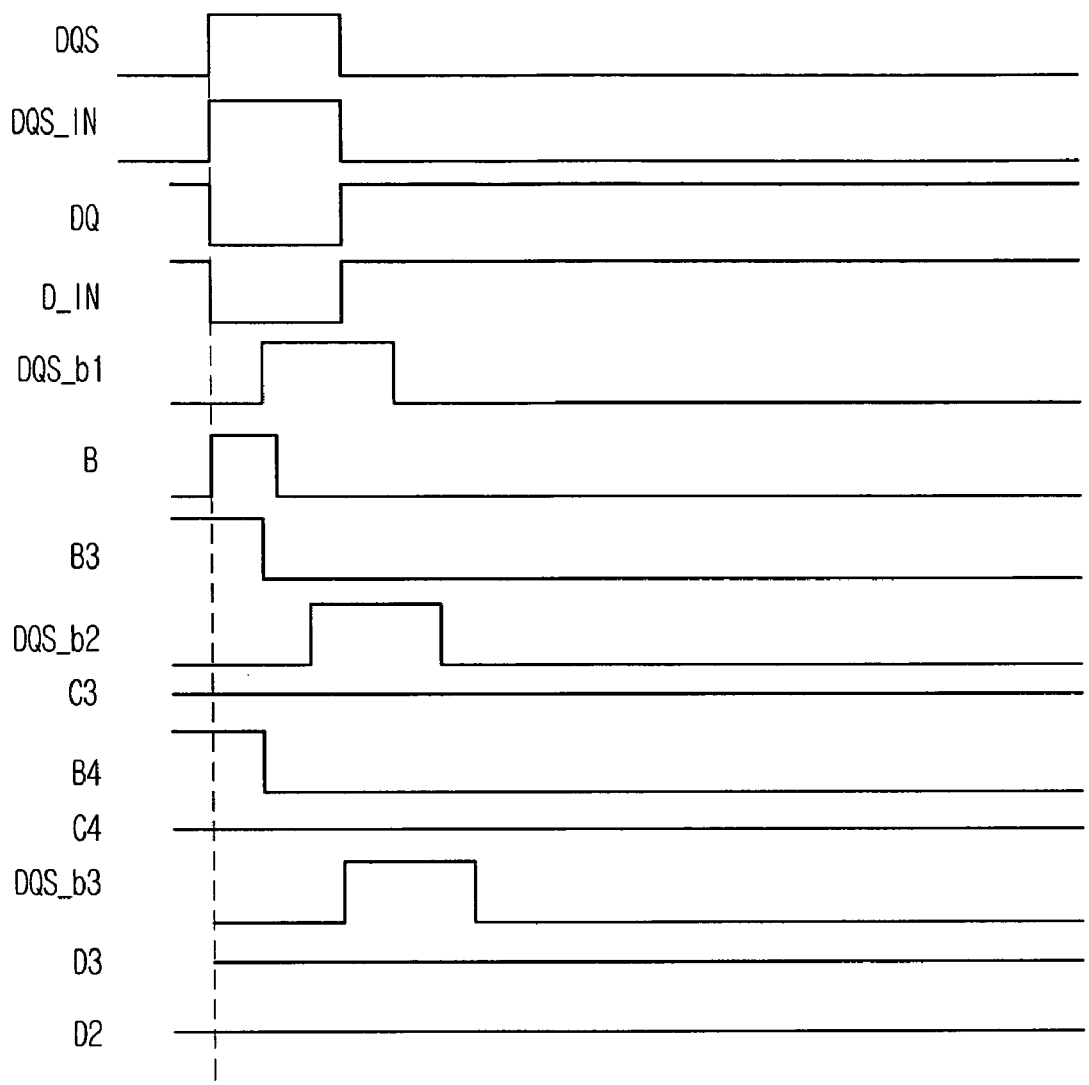
FIG. 10 is a waveform illustrating an operation of calibrating the data setup time when the data signal is inputted later than the data strobe signal.

FIG. 10 is a waveform illustrating an operation of calibrating the data setup time when the data signal is inputted later than the data strobe signal.

The second setup time calibration operation will be described with reference to FIGS. 4 to 10.

If all the first timing detection signals A2 to B2 are inputted to the second setup time control unit 400 in an inactivated state, the data strobe adjustment enable unit 410 activates the enable signal EN. The activation of the enable signal EN means that all of the first timing detection signals A2 to D2 are inputted to the second setup timing control unit 400 in the inactivated state of logic low level. Also, it means that the data setup time cannot be adjusted by delaying the data signals, which are inputted later than the input timing of the data strobe signal DQS.

The timing detection units 420 to 440 compares one pulse signal B with one of the delayed data strobe signals DQS_b1 to DQS_b2, which are outputted from the data strobe signal input unit 300.

For example, if the data strobe signal DQS_b1 is inputted during the pulse period of the inputted pulse signal B, the timing detection unit 420 activates the output signal to a logic low level.

The timing detection signal output unit 450 combines the output signals of the timing detection units 420 and 440 and outputs the second timing detection signals A4 to D4, which are selectively activated. For example, if the output signal B3 is activated, only the second signal B4 among the second timing detection signals A4 to D4 is outputted at an activated state.

If all the output signals B2 to D4 of the timing detection units 420 to 440 are in the inactivated state, only the second timing detection signal A4 provided by buffering the enable signal EN is activated. In this case, the transmission gate T9 of the data strobe signal input unit 300 is turned on, so that the output signal of the data strobe input butter 310 is transferred to the data strobe output buffer 340 without any delay time.

One of the transmission gates T9 to T12 provided at the data strobe input unit 300 is turned on in response to the second timing detection signals A4 to D4, which are selectively activated.

The output timing of the data align signal DQS_align is determined according to the turned-on transmission gates T9 to T12. In FIG. 10, when the pulse signal B and the data strobe signals DQS_b1 to DQS_b3 are respectively compared, if the time period of the pulse signal B is contained in the input timing of the data strobe signal DQS_b1, the second timing detection signal B4 is activated to a logic low level. The remaining second timing detection signals A4, C4 and D4 are inactivated to a logic high level.

Then, the data align unit 500 aligns the data signal Data_D outputted from the data input unit 100 by synchronizing it with the data align signal DQS_align. The aligned data D_align is outputted to the memory core area.

At this time, since the align signal DQS_align inputted to the align unit 500 maintains the optimum setup time in the current system in relation to the input timing of the data signal Data_D outputted from the data input unit, the data align unit 500 can stably align the data without any error.

As described above, the memory device in accordance with the present invention can optimally calibrate the setup time in the OCD calibration operation, which is performed in the initial setting operation of the memory device, even when the setup timing between the input data signal and the data strobe signal is changed due to difference between the design and the current applied state (a state of an external chipset for inputting data, a driving voltage level, etc.).

The present invention can obtain the optimum setup time between the data signal and the data strobe signal. Also, the memory device can perform the reliable data access operation since the data are stably aligned.

As the memory device operates higher frequency, the input timings of the data signal and the data strobe signal may be greatly changed, even if the voltage level difference of the driving operation occurs slight or surrounding conditions such as length of data lines between external chipsets are changed slightly.

The synchronous memory device in accordance with the present invention calibrates the setup time using the input timing of the OCD control code, which is necessarily inputted for the OCD operation, such that the setup time of the memory device is efficiently calibrated. Thus, the memory device is not required to receive an additional control signal for the calibration of the setup timing between the data signal and the data strobe signal. Also, an additional operation of calibrating the setup timing is not required.

In accordance with the present invention, the setup margin between the data signal and the data strobe signal can be calibrated in the OCD calibration mode for adjusting the data output impedance.

Further, the setup margin between the data signal and the data strobe signal can be optimally maintained according to the current state in which the memory device is applied. Thus, the input data can be reliably aligned and outputted to the memory core area. Therefore, the reliability of the data access can be improved at any conditions.

The present application contains subject matter related to Korean patent application No. 2003-98495, filed in the Korean Patent Office on Dec. 29, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A synchronous memory device configured to receive data in synchronization with data strobe signal, comprising:
    a data input unit for calibrating a timing of data inputted in synchronization with the data strobe signal; and
    a first setup time control unit for detecting an input timing of an OCD control code data inputted to the data input unit in an OCD calibration mode, and for controlling a data output timing of the data input unit.

2. The synchronous memory device as recited in claim 1, wherein the first setup time control unit detects an input timing of the data strobe signal, which corresponds to the input timing of the OCD control code data, and outputs a plurality of first timing detection signals, which are selectively activated, such that the data output timing of the data input unit is calibrated in response to the first timing detection signals.

3. The synchronous memory device as recited in claim 2, further comprising:
    a data strobe signal input unit for generating a data align signal using the data strobe signal; and
    a second setup time control unit for controlling an output timing of the data align signal in response to the first timing detection signals.

4. The synchronous memory device as recited in claim 3, further comprising a data align unit for aligning consecutive output data signals of the data input unit in synchronization with the data align signal.

5. The synchronous memory device as recited in claim 3, wherein the data input unit includes:
    an input buffer for buffering input data signals;
    a first delay unit for delaying data signals outputted from the input buffer and outputting a plurality of first data signals, each of which has a different delay time;
    a second delay unit for delaying the data signals of the input buffer and the plurality of first data signals by a predetermined setup time and outputting a plurality of second data signals;
    a data transfer unit for outputting one data signal selected among the data signal of the input buffer and the plurality of first data signals in response to the plurality of first timing control signals; and
    an output buffer for buffering the data signal outputted from the data transfer unit.

6. The synchronous memory device as recited in claim 5, wherein the first delay unit includes a plurality of serially-connected unit delay elements, each of which has an equal unit delay time, the plurality of first data signals being outputted from the respective unit delay elements.

7. The synchronous memory device as recited in claim 5, wherein the data transfer unit is selectively turned on in response to the plurality of first timing control signals and outputs the data signals of the input buffer and the plurality of first data signals.

8. The synchronous memory device as recited in claim 5, wherein the first setup time control unit includes:
    a setup time detecting pulse generating unit for generating a plurality of pulse signals having pulse periods corresponding to intervals between the data signal of the input buffer and the plurality of first data signals; and
    a timing detecting unit configured to be enabled in response to the OCD control signal activated in the OCD calibration mode, for comparing the input timing of the data strobe signal with the pulse periods of the plurality of pulse signals and outputting the plurality of first timing detection signals.

9. The synchronous memory device as recited in claim 8, wherein the setup time detecting pulse generation unit includes a plurality of exclusive NOR gates, which respectively receive the data signal of the input buffer and the plurality of first data signals and output the plurality of pulses signals.

10. The synchronous memory device as recited in claim 8, wherein the timing detection unit includes:
   a plurality of unit timing detection units for receiving one of the plurality of pulse signals and activating output signals if the input timing of the data strobe signal is contained during the activation period of the inputted pulse signal; and
   a timing detection signal output unit for receiving the output signals of the unit timing detection units and outputting the plurality of first timing control signals, which are selectively activated.

11. The synchronous memory device as recited in claim 10, wherein each of the unit timing detection units includes:
   a timing detection signal input unit for receiving one of the plurality of pulse signals at the input timing of the data strobe signal;
   a transmission gate configured to be turned on in response to the OCD control signal and transfer an output signal of the timing detection signal input unit; and
   a latch for latching the output signal of the transmission gate.

12. The synchronous memory device as recited in claim 11, wherein the timing detection signal input unit includes an operational amplifier configured to be enabled in response to the data strobe signal, the operational amplifier having a positive terminal receiving the pulse signal and a negative terminal receiving a reference signal.

13. The synchronous memory device as recited in claim 5, wherein the data strobe signal input unit includes:
   a data strobe signal input buffer for buffering the data strobe signal;
   a third delay unit for delaying the data strobe signal to output a plurality of delayed data strobe signals having different delay time;
   a data strobe signal transfer unit for transferring one signal selected among the output data signal of the data strobe signal input buffer and the plurality of delayed data strobe signals in response to a plurality of second timing control signals outputted from the second setup time control unit; and
   a data strobe signal output buffer for buffering the output signal of the data strobe signal transfer unit and outputting the data align signal.

14. The synchronous memory device as recited in claim 13, wherein the data strobe signal transfer unit includes a plurality of transmission gates configured to be respectively turned on in response to the plurality of second timing control signals and transfer the plurality of data strobe signals.

15. The synchronous memory device as recited in claim 14, wherein the third delay unit includes serial-connected data strobe target delay elements, each of which has an equal delay time, for outputting the plurality of delayed data strobe signals.

16. The synchronous memory device as recited in claim 13, wherein the second setup time control unit includes:
   a data strobe adjustment enable unit for detecting states of the plurality of first timing detection signals and activating an enable signal if all the first timing detection signals are in an inactivated state;
   a plurality of unit timing detection units configured to be enabled in response to the OCD control signal, for comparing a timing of one first pulse signal selected among the plurality of pulse signals with a timing of one signal selected among the plurality of delayed data strobe signals; and
   a timing detection signal output unit configured to be enabled in response to the enable signal, for combining the output signals of the plurality of unit timing detection units and outputting the second timing detection signals.

17. The synchronous memory device as recited in claim 16, wherein the unit timing detection unit includes:
   a timing detection signal input unit for receiving the first pulse signal at an input timing of one delayed data strobe signal;
   a transmission gate configured to be turned on in response to the OCD control signal, for transferring an output signal of the timing detection signal input unit; and
   a latch for latching the output signal of the transmission gate.

18. The synchronous memory device as recited in claim 17, wherein the timing detection signal input unit includes an operational amplifier configured to be enabled in response to one of the plurality of delayed data strobe signal, the operational amplifier having a positive terminal receiving the first pulse signal and a negative terminal receiving a reference signal.

19. A method for driving a synchronous memory device configured to receive data in synchronization with data strobe signal, the synchronous memory device having an OCD calibration mode, the method comprising the steps of:
   detecting an input timing of an OCD control code data, the OCD control code being synchronized with the data strobe signal and inputted to a data input unit for an OCD calibration mode; and
   calibrating a data setup timing of the data input unit using the input timing of the detected OCD control code.

20. The method as recited in claim 19, further comprising the step of aligning an output data of the data input unit, whose data setup timing is calibrated, in response to the data strobe signal.

21. The method as recited in claim 19, wherein the step of detecting the input timing of the OCD control code includes the steps of:
   buffering the OCD control code inputted to the data input unit;
   delaying the buffering OCD control code to output a plurality of delayed signals having different delay time;
   generating a plurality of pulse signals having pulse periods corresponding to intervals of the plurality of delayed signals;
   comparing the pulse periods with the input timing of the data strobe signal; and
   outputting a data input timing detection signal corresponding to a result of the comparison.

22. The method as recited in claim 21, wherein the step of calibrating the data setup timing includes the steps of:
   delaying the output signal of the data input unit to output a plurality of delayed data signals having different delay time; and
   outputting one delayed data signal corresponding to the input timing detection signal among the plurality of delayed data signals.

23. The method as recited in claim 22, further comprising the steps of:
  delaying the data strobe signal by a predetermined time if the input timing of the data strobe signal is not contained in the pulse periods of the plurality of pulse signals; and
  aligning the data outputted from the data input buffer in synchronization with the delayed data strobe signal.

24. The method as recited in claim 23, wherein the step of delaying the data strobe signal includes the steps of:
  detecting a timing of one pulse signal, which is selected among the plurality of pulse signals, and a timing of the data strobe signal; and
  delaying the data strobe signal by a delay time corresponding to a value detected at the step of detecting the timing.

25. The method as recited in claim 24, wherein the step of detecting the timing of the data strobe signal includes the steps of:
  delaying the data strobe signal by a different delay time; and
  comparing the selected pulse signal with the plurality of delayed data strobe signals.

* * * * *